United States Patent [19]
Lee

[11] Patent Number: 6,121,801
[45] Date of Patent: *Sep. 19, 2000

[54] NON-INTEGER CLOCK DIVIDER

[75] Inventor: Dennis Lee, Sunnyvale, Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/779,543

[22] Filed: Jan. 8, 1997

[51] Int. Cl.[7] .................................................. H03B 19/00
[52] U.S. Cl. ............................. 327/115; 327/117; 377/48
[58] Field of Search .................................... 327/115, 116, 327/117, 113, 114; 377/47, 48

[56] References Cited

U.S. PATENT DOCUMENTS

| | | | |
|---|---|---|---|
| 4,270,204 | 5/1981 | Gordon | 370/112 |
| 5,339,345 | 8/1994 | Mote | 377/48 |
| 5,384,816 | 1/1995 | Prysby et al. | 377/48 |

OTHER PUBLICATIONS

David A. Bell, Solid State Pulse Circuits, Second Edition, p. 354, Jan. 1981.

*Primary Examiner*—Timothy P. Callahan
*Assistant Examiner*—Minh Nguyen
*Attorney, Agent, or Firm*—Sawyer Law Group LLP

[57] ABSTRACT

A system for providing a non-integer division of a single clock signal in a communication device, the communication device including at least two modules is provided. In a system aspect, the system includes first and second divider circuits within one module of the at least two modules, the first and second divider circuits dividing the single clock signal to produce a first clock signal and a second clock signal. The system further includes logic means within the one module and coupled to the first and second divider circuits, the logic means logically combining the first and second clock signals to produce a non-integer division of the single clock signal for use by the other module of the at least two modules.

12 Claims, 2 Drawing Sheets

NON-INTEGER CLOCK DIVIDER

FIELD OF THE INVENTION

The present invention relates to clock signal generation and more particularly to division of a clock signal by a non-integer value.

BACKGROUND OF THE INVENTION

Systems for portable, radio-based, digital communication often employ three basic modules, an IF (intermediate frequency) module, an RF (radio frequency) module, and a baseband processing module. Generally, the components used within each module and/or the modules themselves originate from different vendors. Inherently, then, differences exist among the modules, including operation regulated by differing clock frequencies. Unfortunately, accommodating these varying frequencies often is cumbersome and costly.

A simple approach to providing the different clocks results in the use of separate oscillators within the device. As shown in FIG. 1, crystal 1 would provide the clock signal for a baseband module 10, crystal 2 would provide the clock signal for an IF module 12, and crystal 3 would provide the clock signal for an RF module 14. However, the size, weight, and power consumption of the device increases with the addition of the separate oscillators, which hinders the intended portable nature of the device. Further, cost increases with each additional component, as well as susceptibility to variability among the components with the production of numerous devices.

Another approach incorporates flip-flops and combinational logic within the baseband module 10 to allow division of a single clock into the necessary clock frequencies for the remaining modules. However, this latter approach is limited to division by integer values. Thus, for systems having modules whose required frequencies vary by non-integer values, e.g., by a factor of 2.5, successful operation relies on the use of multiple oscillators. As mentioned above, incorporation of multiple components is not efficient.

Accordingly, a need exists for generation of non-integer divisions of a single clock to meet operational requirements in a cost-effective and successful manner.

SUMMARY OF THE INVENTION

The present invention addresses this need through aspects for a system for providing a non-integer division of a single clock signal in a communication device, the communication device including at least two modules. In a system aspect, the system includes first and second divider circuits within one module of the at least two modules, the first and second divider circuits dividing the single clock signal to produce a first clock signal and a second clock signal. The system further includes logic means within the one module and coupled to the first and second divider circuits, the logic means logically combining the first and second clock signals to produce a non-integer division of the single clock signal for use by the other module of the at least two modules.

In a circuit aspect, and method for producing same, the circuit includes a first divider circuit, the first divider circuit using a positive edge of the single clock signal to produce a first clock signal, and a second divider circuit, the second divider circuit using a negative edge of the single clock signal to produce a second clock signal. Further included is a logic means coupled to the first divider circuit and the second divider circuit to logically combine the first clock signal and the second clock signal for output of a non-integer division of the single clock signal. Additionally, the first divider circuit further includes a first counter circuit and first combinational logic, while the second divider circuit includes a second counter circuit and second combinational logic.

Through the aspects of the present invention, a non-integer division of the clock signal comprising a half-integer multiple of a single clock signal is achieved. The ability to provide non-integer divisions from a single oscillator provides greater flexibility and efficiency for portable communications devices. Further, the addition of logic circuitry to produce such divisions is readily provided through standard logic devices, thus improving device operations without significantly increasing device costs. These and other advantages of the aspects of the present invention will be more fully understood in conjunction with the following detailed description and accompanying drawings.

BRIEF DESCRIPTION OF THE DRAWINGS

FIG. 2b illustrates a block diagram of a more specific example of the system of FIG. 2a.

DETAILED DESCRIPTION

The present invention relates to producing non-integer divisions of a clock signal. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
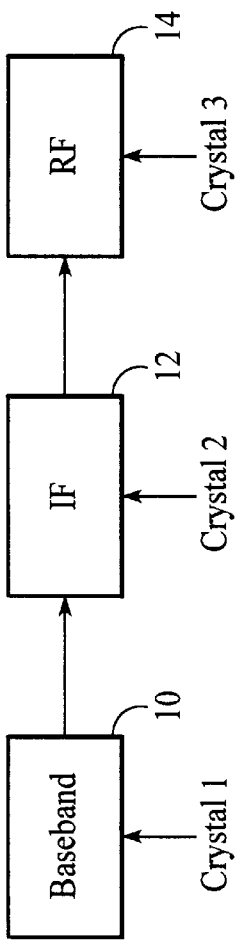
FIG. 1 illustrates a block diagram of a typical approach to supplying three modules with three clock frequencies in a communication device.
Figure 2A:
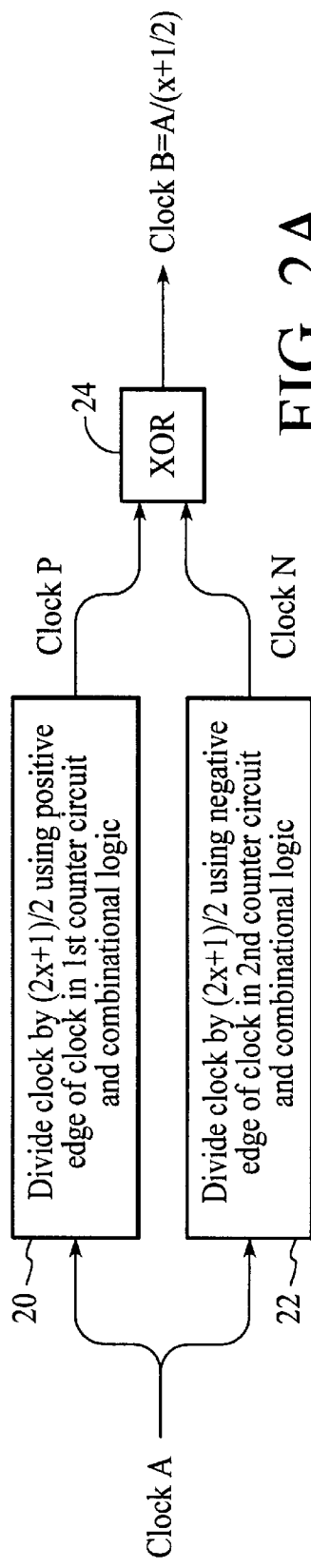
FIG. 2a illustrates a block diagram of a system for providing non-integer divisions of a reference clock signal in accordance with the present invention.

In accordance with the present invention, rising and falling edges of a single clock signal are effectively used to trigger counters and produce pulses that are logically combined and result in half-integer multiples of the clock signal. A general block diagram of a preferred approach to providing a circuit for incorporation into the baseband module 10 (FIG. 1) resulting in production of non-integer divided clock signals for IF 12 and RF 14 modules (FIG. 1) is presented with reference to FIG. 2a. It should be appreciated that although the modules are shown separately, all of the modules may be provided in a single chip, the modules may each be in separate chips, or a combination of the modules can be embodied in a single chip or separate chips and their use would be within the spirit and scope of the present invention. The key feature being that each of the modules requires differing clock signals, depending on design needs, as is well understood by those skilled in the art. Referring to FIG. 2a, a clock signal, Clock A, is suitably input into two divider circuits, 20 and 22. A first divider circuit 20 divides the Clock A signal by (2x+1) using the positive edge of the Clock A signal, resulting in a second clock signal, Clock P.

Similarly, a second divider circuit 22 divides the Clock A signal by (2x+1) using the negative edge of the Clock A signal, resulting in a third clock signal, Clock N. The Clock P and Clock N signals are then suitably combined logically in this example, e.g., with XOR (exclusive-OR) logic 24, to result in a fourth clock signal, Clock B, which is the Clock A signal divided by (x+½). Although in the present example clock P and clock N are combined utilizing an XOR logic, one of ordinary skill in the art readily recognizes that different types of logic circuits could be utilized and their use would be within the spirit and scope of the present invention. Preferably, the value 'x' is chosen to produce an appropriate half-integer multiple of the Clock A signal for the Clock B output.

Figure 2B:
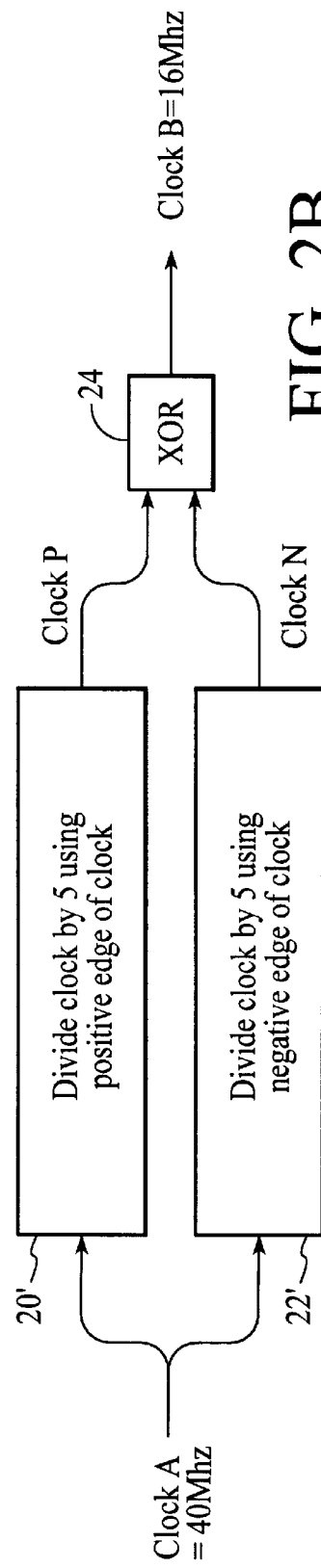

FIGS. 2b, 3, 4, and 5 present a more specific example of implementation of the non-integer division of a clock signal in accordance with the present invention. By way of example, as shown in FIG. 2b, a 16 MHz (MegaHertz) clock signal is capably produced from a 40 MHz clock signal with the utilization of the present invention. Suitably, a Clock A signal with a frequency of 40 MHz is input to divider circuit 20' that divides Clock A by 5 using the positive edge of Clock A, and divider circuit 22' that similarly divides Clock A by 5, but uses the negative edge of Clock A. The resulting Clock P and Clock N signals are then suitably XORed to produce Clock B with a frequency of 16 MHz. Since 40 MHz is 2.5 times 16 MHz, the value for 'x' in this example is 2.

Figure 3:
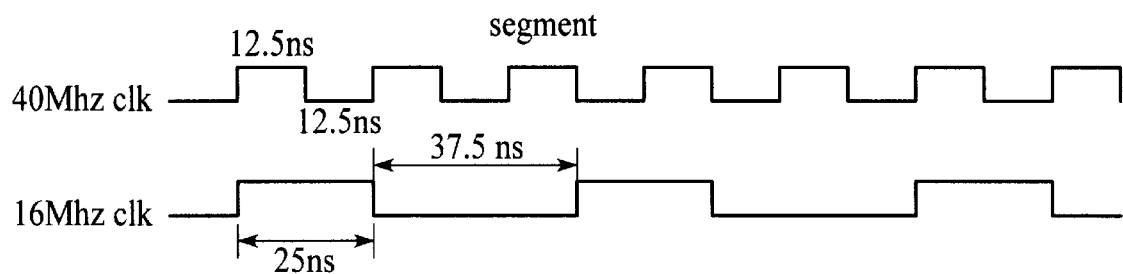
FIGS. 3 and 4 illustrate diagrams showing the relationship between the reference clock signal and output signal for the example of FIG. 2b.

FIG. 3 illustrates a timing diagram for the example situation, i.e., Clock A, having a frequency of 40 MHz, and Clock B, having a frequency of 16 Mhz. When the Clock A signal has a 50% duty cycle and a period of 25 ns (nanoseconds), the high time and low time of the Clock A signal is 12.5 ns, ignoring the rise time and delay time for illustrative purposes. Thus, a segment from a rising edge of the Clock A signal to a falling edge and from a falling edge to a rising edge is 12.5 ns. The Clock B signal suitably has a high time of 25 ns and a low time of 37.5 ns for the 16 MHz signal with a 62.5 ns period. Thus, the high time of the Clock B signal is equivalent to two segments of the Clock A signal, and the low time of the Clock B signal is equivalent to three segments of the Clock A signal.

Figure 4:
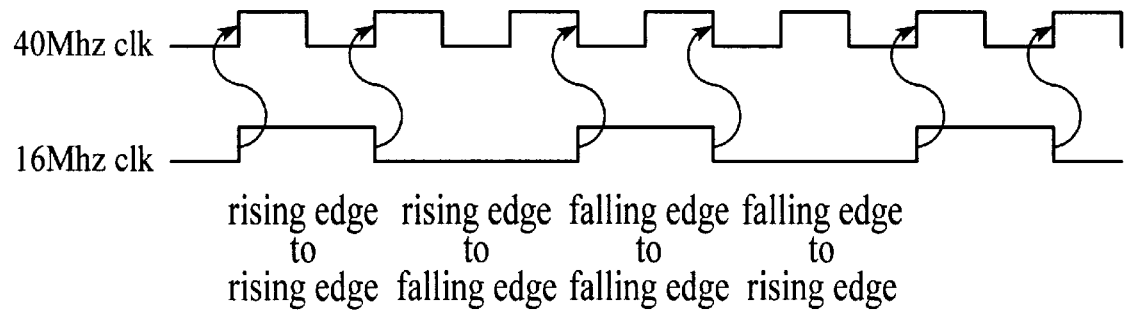

As shown by FIG. 4, the first high time of the Clock B signal is equivalent to the two segments from a rising edge to rising edge in the Clock A signal. The first low time of the Clock B signal is equivalent to the three segments from a rising edge to falling edge in the Clock A signal. A next high time of the Clock B signal is equivalent to the two segments from a falling edge to falling edge in the Clock A signal. A next low time of the Clock B signal is equivalent to the three segments from a falling edge to rising edge in the Clock A signal. These four different sets of segments forming the pulses for the Clock B signal are suitably generated from the Clock A signal in accordance with the present invention through the use of the divider circuits 20' and 22'.

Referring back to FIG. 2a, the two divider circuits 20 and 22 are suitably formed using flip-flops and combinational logic, as is well appreciated by those skilled in the art. Since flip-flops can be clocked only by the falling edges or rising edges of a clock signal, and identifying occurrences of both falling and rising edges in the single, reference clock signal, e.g., Clock A, is necessary, two divider circuits are preferably formed. Suitably then, the rising edges of the Clock A signal drive the clock signal for flip-flops forming a first counter circuit within divider circuit 20, while the falling edges of the Clock A signal drive the clock signal for flip-flops forming a second counter circuit within divider circuit 22. Each counter circuit appropriately provides an output value that is decoded by accompanying combinational logic within each divider circuit 20 and 22 to create a pulse when a predetermined count value has been reached, as is well understood by those skilled in the art. Preferably, the pulse width is equivalent to a integer multiple of the Clock A signal's period, resulting in the clock signals, Clock P and Clock N, as suitably generated by the respective divider circuits 20 and 22.

Figure 5:
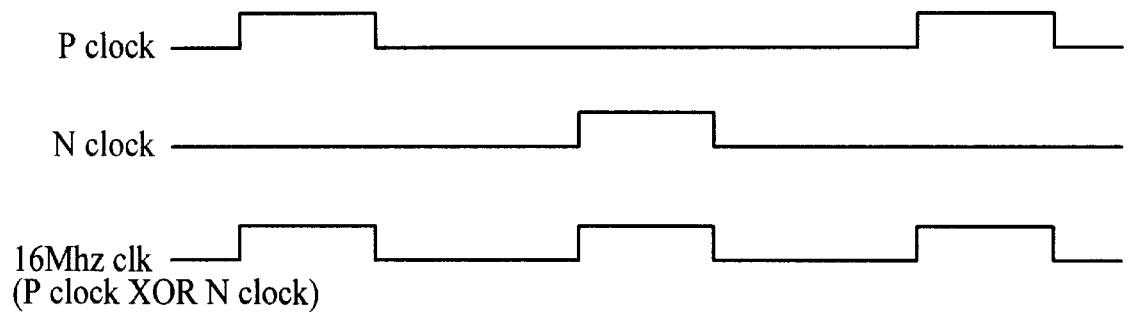
FIG. 5 illustrates a diagram showing the relationship among first and second clock signals and the output signal for the example of FIG. 2b.

FIG. 5 illustrates a timing diagram of the relationship among the Clock P and Clock N signals that result in the Clock B signal for the example situation of FIG. 2b. The Clock P signal resulting from the divider circuit 20' clocked by the positive edge of the Clock A signal provides an 8 MHz signal with a two segment high time and an eight segment low time. Similarly, the Clock N signal resulting from divider circuit 22' clocked by the negative edge of the Clock A signal provides an 8 MHz signal with a two segment high time and eight segment low time. The two segment pulse in the Clock P signal suitably occurs when the first and sixth positive edge in the Clock A signal occurs, as determined via the counter circuit within divider circuit 20', while the two segment pulse in the Clock N signal suitably occurs when the third and eighth negative edge in the Clock A signal occurs, as determined using the counter circuit within divider circuit 22'. Further, by skewing the phases of the Clock P and Clock N signals by an appropriate amount during reset of the divider circuits, the XORing of the two signals provides the Clock B signal that has a high time of 25 ns and a low time of 37.5 ns to form the 16 MHz clock signal.

Thus, a single, reference clock signal efficiently produces additional clock signals with frequencies that are non-integer divisions of the reference clock signal through the present invention. As illustrated, half-integer divisions are readily achieved through the aspects of the present invention. Additionally, with the present invention, dissimilarity among modules in communication devices is practically and effectively accommodated by utilizing a single oscillator.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A circuit for providing non-integer divisions of a single clock signal, the circuit comprising:
   a first divider circuit, the first divider circuit using a positive edge of the single clock signal to produce a first clock signal and comprising a first counter circuit and first combinational logic;
   a second divider circuit, the second divider circuit using a negative edge of the single clock signal to produce a second clock signal and comprising a second counter circuit and second combinational logic; and
   a logic means coupled to the first divider circuit and the second divider circuit to logically combine the first clock signal and the second clock signal for output of a non-integer division by a factor of (x+½), including x>1, of the single clock signal from the logic means.

2. The circuit of claim 1 wherein the logic means further comprises an XOR gate.

3. A method for producing a non-integer division of a single clock signal, the method comprising:

forming a first divider circuit including a first counter circuit and first combinational logic, the first divider circuit using a positive edge of the single clock signal to produce a first clock signal;

forming a second divider circuit including a second counter circuit and second combinational logic, the second divider circuit using a negative edge of the single clock signal to produce a second clock signal; and providing a logic means coupled to the first divider circuit and the second divider circuit to logically combine the first clock signal and the second clock signal for output of a non-integer division by a factor of (x+½) including x>1, of the single clock signal from the logic means.

4. The method of claim 3 wherein providing the logic means further comprises providing an XOR gate.

5. A system for providing a non-integer division of a single clock signal in a device, the device further comprising at least two modules, the system comprising:

first and second divider circuits within a baseband module of the at least two modules, the first and second divider circuits dividing the single clock signal to produce a first clock signal and a second clock signal, the first divider circuit comprising a first counter circuit coupled to first combinational logic to produce the first clock signal, and the second divider circuit comprising a second counter circuit coupled to second combinational logic to produce the second clock signal; and logic means within the baseband module and coupled to the first and second divider circuits, the logic means logically combining the first and second clock signals to produce a non-integer division by a factor of (x+½), including x>1, of the single clock signal from the logic means for use by the other module of the at least two modules.

6. The system of claim 5 in which the at least two modules are in a single chip.

7. The system of claim 5 in which the at least two modules are in separate chips.

8. The system of claim 5 wherein the first divider circuit further uses a positive edge of the single clock signal.

9. The system of claim 5 wherein the second divider circuit further uses a negative edge of the single clock signal.

10. The system of claim 5 wherein the logic means further comprises an XOR gate.

11. The system of claim 5 wherein the other of the at least two modules further comprises an IF module.

12. The system of claim 5 wherein the other of the at least two modules further comprises an RF module.

\* \* \* \* \*